(12) United States Patent
Ramasamy et al.

(10) Patent No.: US 8,492,181 B2
(45) Date of Patent: Jul. 23, 2013

(54) EMBEDDED WAFER LEVEL OPTICAL PACKAGE STRUCTURE AND MANUFACTURING METHOD

(75) Inventors: Anandan Ramasamy, Singapore (SG); KahWee Gan, Singapore (SG); Hk Looi, Yishun (SG); David Gani, Yishun (SG)

(73) Assignee: STMicroelectronics Pte Ltd., Singapore (SG)

( * ) Notice: Subject to any disclaimer, the term of this patent is extended or adjusted under 35 U.S.C. 154(b) by 0 days.

(21) Appl. No.: 13/335,548

(22) Filed: Dec. 22, 2011

(65) Prior Publication Data

US 2013/0164867 A1    Jun. 27, 2013

(51) Int. Cl.
 *H01L 21/00*    (2006.01)
(52) U.S. Cl.
 USPC .......... 438/28; 257/E21.499; 438/25; 438/26; 438/106; 438/112; 438/118; 438/125; 438/126; 438/127
(58) Field of Classification Search
 USPC ................... 257/678, 737, 738, 787; 438/25, 438/26, 28, 106, 112, 118, 125, 126, 127
 See application file for complete search history.

(56) References Cited

U.S. PATENT DOCUMENTS

| 2011/0215342 A1* | 9/2011 | Oliver | 257/81 |
| 2012/0025211 A1* | 2/2012 | Yeh et al. | 257/82 |
| 2012/0074432 A1* | 3/2012 | Chou | 257/88 |

* cited by examiner

*Primary Examiner* — Asok K Sarkar
(74) *Attorney, Agent, or Firm* — Hogan Lovells US LLP

(57) ABSTRACT

A method of forming an embedded wafer level optical package includes attaching a sensor die, PCB bars and an LED on adhesive tape laminated on a carrier, attaching a dam between two light sensitive sensors of the sensor die, encapsulating the sensor die, the PCB bars, the LED, and the dam in an encapsulation layer, debonding the carrier, grinding a top surface of the encapsulation layer, forming vias through the encapsulation layer to the sensor die and the LED, filling the vias with conductive material, metalizing the top surface of the encapsulation layer, dielectric coating of the top surface of the encapsulation layer, dielectric coating of a bottom surface of the encapsulation layer, patterning the dielectric coating of the bottom surface of the encapsulation layer, and plating the patterned dielectric coating of the bottom surface of the encapsulation layer.

21 Claims, 13 Drawing Sheets

EMBEDDED WAFER LEVEL OPTICAL PACKAGE STRUCTURE AND MANUFACTURING METHOD

BACKGROUND OF THE INVENTION

1. Field of the Invention

The present invention is related to optical packages, and more specifically, packaging of optical semiconductor sensors and LEDs using wafer level packaging, designated "eWLOP" (embedded Wafer Level Optical Package).

2. Relevant Background

Referring now to FIG. 1, a prior art optical package 10 includes a substrate 12, a sensor die 14, an LED 16, optical adhesive material 18, molding material 20, cap layer 22, and glass layer 24.

While the package 10 is functionally sufficient for packaging optical sensors and LEDs, the thickness, footprint size, cost, and component count could all be improved.

What is desired, therefore, is a novel optical package that in fact improves on one or more of the above aspects of the prior art optical package.

SUMMARY OF THE INVENTION

A method of forming an embedded wafer level optical package according to the present invention includes attaching a sensor die, PCB (Printed Circuit Board) bars and an LED on adhesive tape laminated on a carrier, attaching a dam between two light sensitive sensors of the sensor die, encapsulating the sensor die, the PCB bars, the LED, and the dam in an encapsulation layer, debonding the carrier, grinding a top surface of the encapsulation layer, forming vias through the encapsulation layer to the sensor die and the LED, filling the vias with conductive material, metalizing the top surface of the encapsulation layer, dielectric coating of the top surface of the encapsulation layer, dielectric coating of a bottom surface of the encapsulation layer, patterning the dielectric coating of the bottom surface of the encapsulation layer, plating the patterned dielectric coating of the bottom surface of the encapsulation layer, and solder balling the plated and patterned dielectric coating of the bottom surface of the encapsulation layer.

The dam can comprise a mold compound or silicon. Attaching the dam can comprise attachment using UV light or attachment using a heat curable glue. Encapsulation comprises encapsulation using a transparent mold compound. Grinding the encapsulation layer comprises grinding to a thickness that exposes the PCB bars. The vias are formed using laser drilling or laser ablation. Metalizing the top surface of the encapsulation layer comprises metalizing with copper lines using sputtering, patterning and plating. Dielectric coating of the top surface comprises using a transparent dielectric material. Patterning the dielectric coating of the bottom surface of the encapsulation layer comprises using a lithography process. Plating the patterned dielectric coating of the bottom surface of the encapsulation layer comprises using UBM (Under Bump Metalization) plating.

According to the optical package of the present invention, it is an advantage that a thinner package can be realized because the prior art substrate is removed. The optical package of the present invention has a smaller size (footprint). Finally, the cost is reduced since the substrate, cap layer, and glass layer are removed in favor of a transparent molding compound according to the present invention.

DETAILED DESCRIPTION OF THE PREFERRED EMBODIMENTS

Referring now to FIGS. 2-12, a method of forming an embedded wafer level optical package is illustrated using sequential cross-sectional and plan-view drawing figures.

Figure 1:
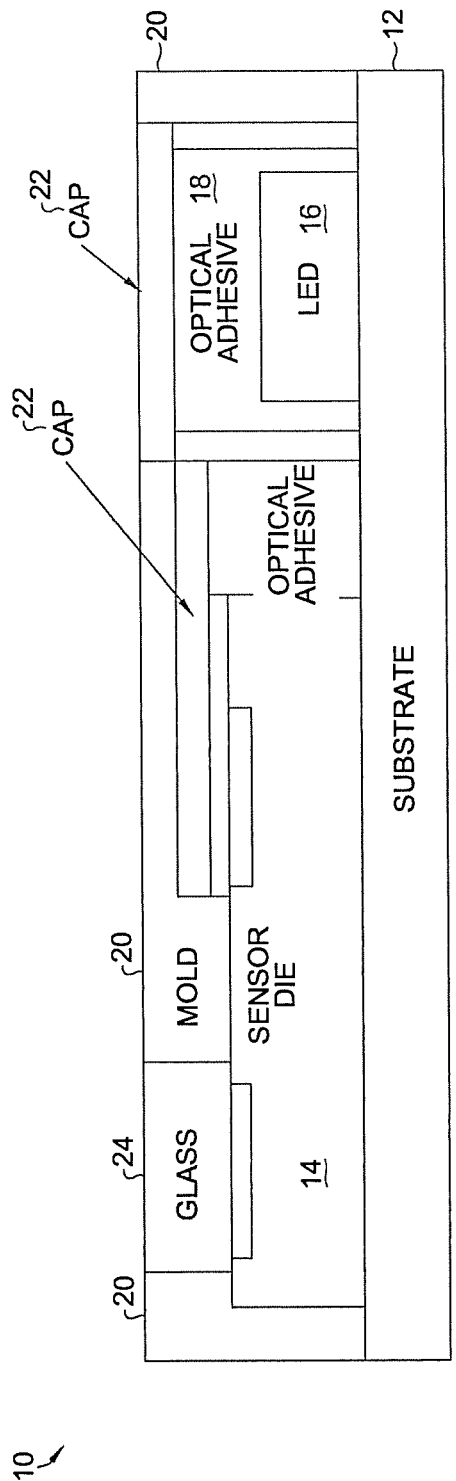
FIG. 1 is a cross section of an optical package according to the prior art.
Figure 2:
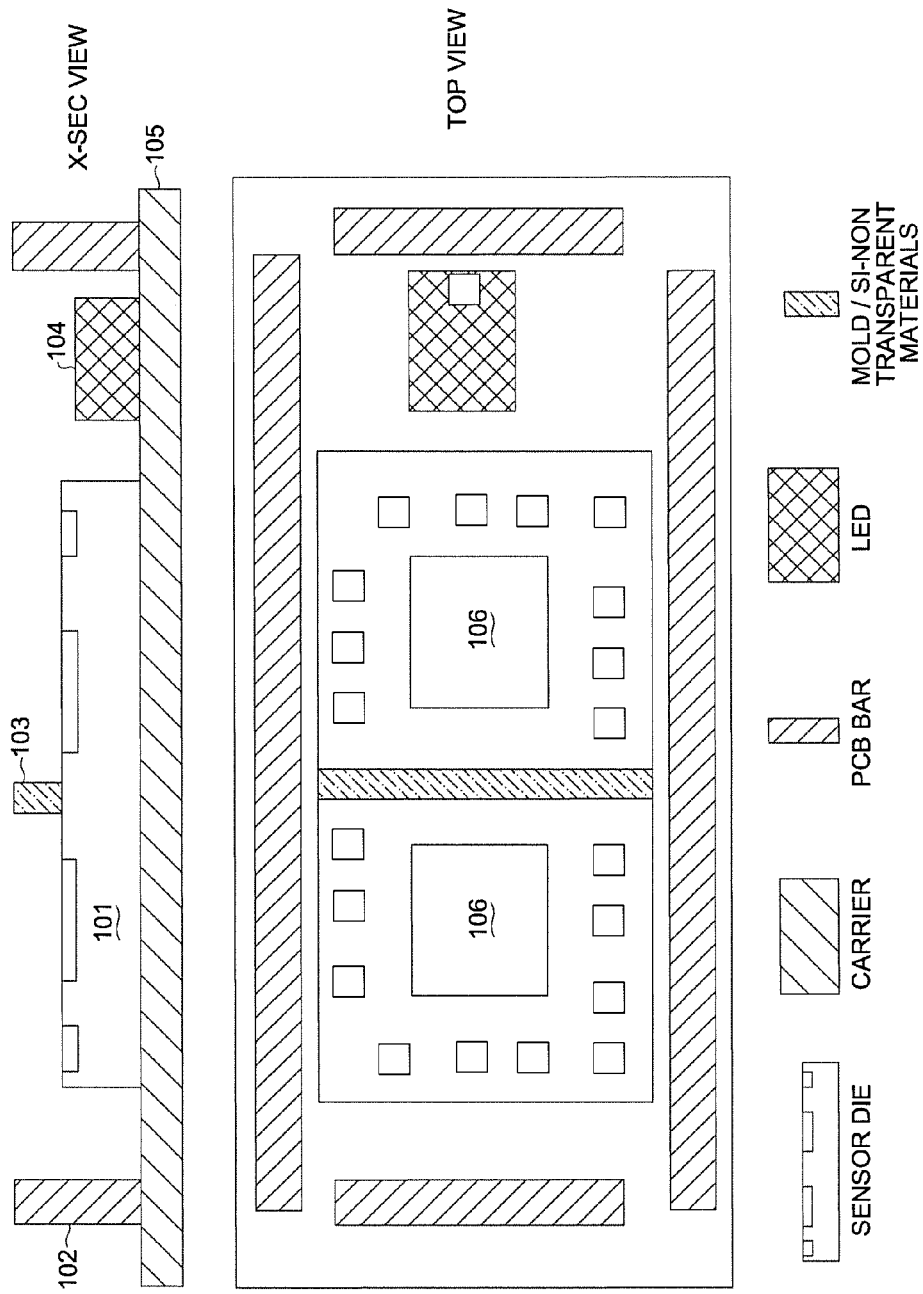
FIGS. 2-12 are sequential cross-sectional and plan views of a method of manufacturing a embedded wafer level optical package according to the present invention.

Referring now to FIG. 2, a PnP (Pick and Place) of components on a carrier 105 with double-sided tape is shown. FIG. 2 shows attaching a sensor die 101, PCB bars 102 and an LED 104 on adhesive tape laminated on a carrier 105, and attaching a dam 103 between two light sensitive sensors 106 of the sensor die 101.

Figure 3:
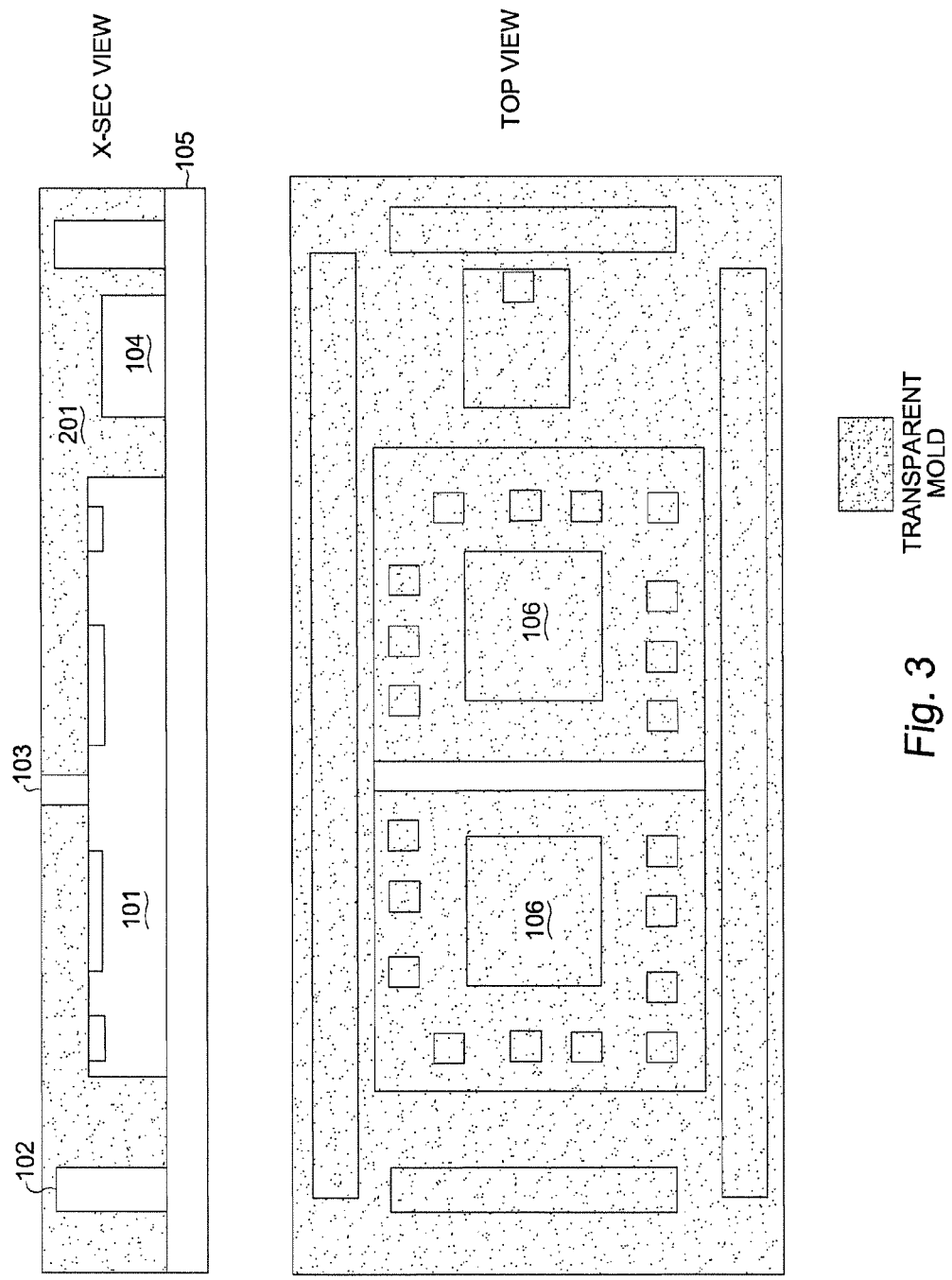

Referring now to FIG. 3, transparent molding to create an encapsulation layer 201 is shown. FIG. 3 shows encapsulating the sensor die 101, the PCB bars 102, the LED 104, and the dam 103 in an encapsulation layer 201. The term "transparent" is defined as allowing 80% or more of the impinging light to pass through the material.

Figure 4:
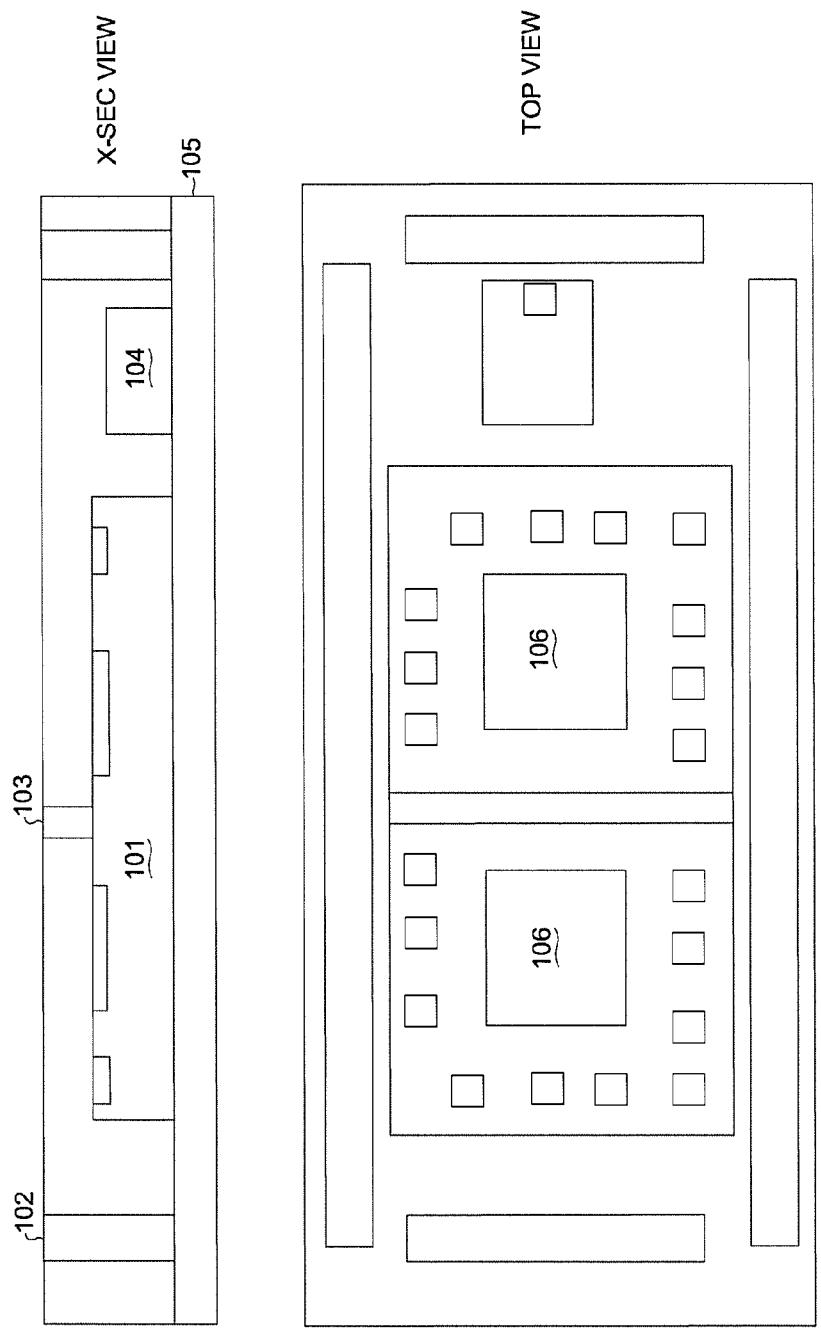

Referring now to FIG. 4, grinding is performed to expose the PCB bars 102. FIG. 4 thus shows grinding a top surface of the encapsulation layer 201.

Figure 5:
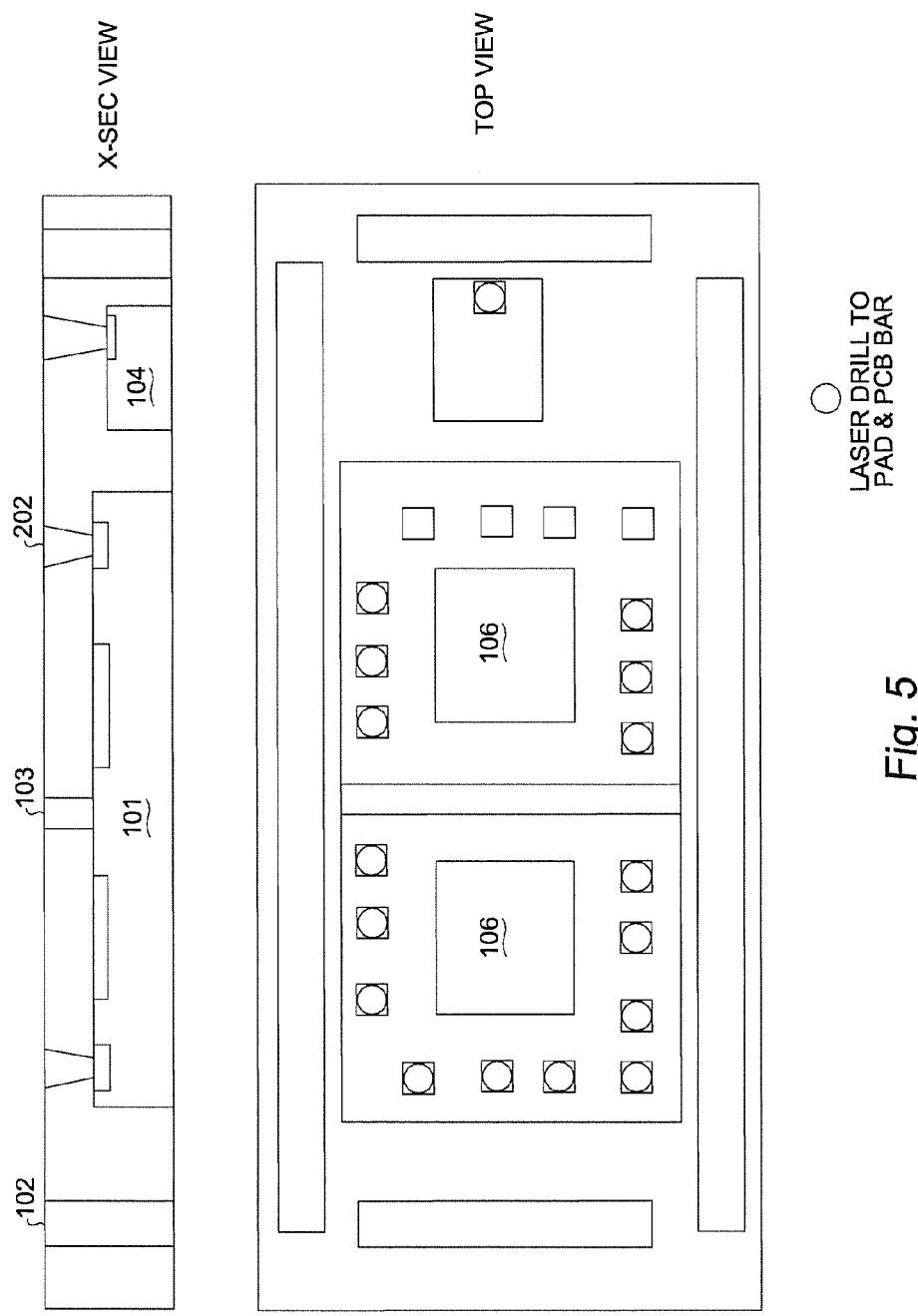

Referring now to FIG. 5, laser drilling of vias 202 and debonding of the carrier 105 is shown. FIG. 5 thus shows forming vias 202 through the encapsulation layer 201 to the sensor die 101 and the LED 104.

Figure 6:
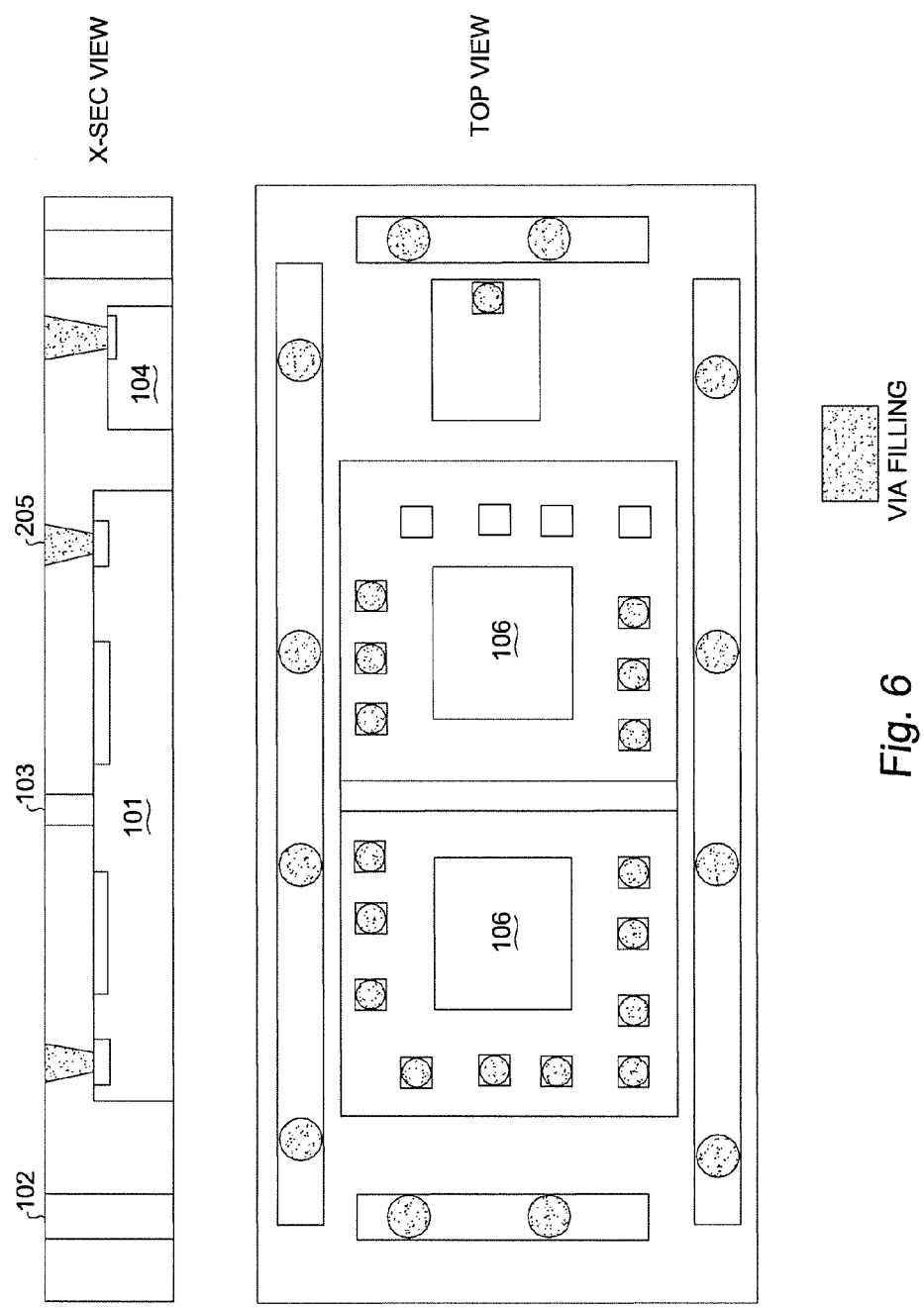

Referring now to FIG. 6, via filling, using plating or paste is shown. FIG. 6 thus shows filling the vias 202 with a conductive material 205.

Figure 7:
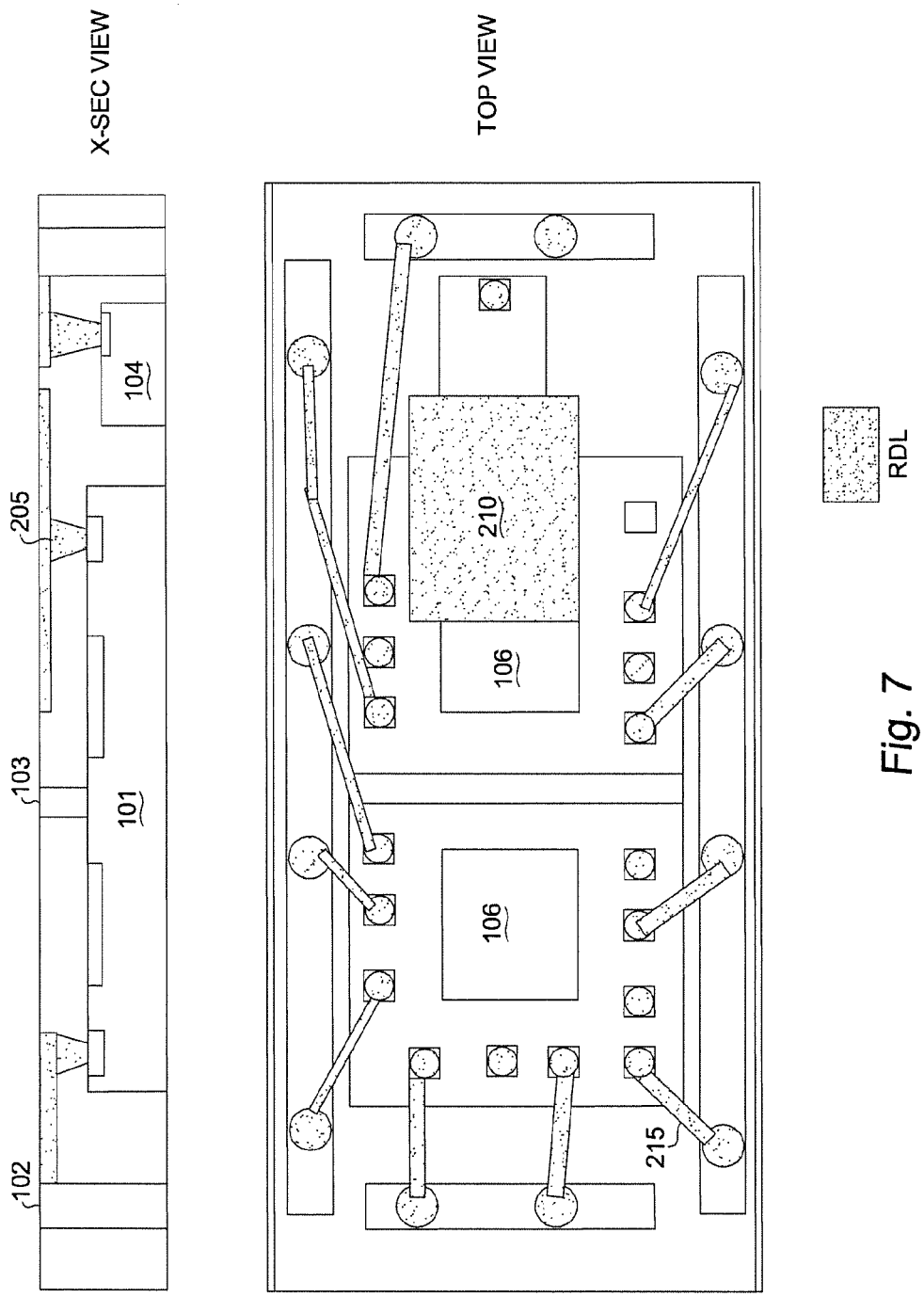

Referring now to FIG. 7, a top side RDL (ReDistribution interconnect Layer) process is shown. FIG. 7 thus shows metalizing 210, 215 the top surface of the encapsulation layer 201.

The dimensions of metalization 210 are used for a reflective purpose, and so the exact dimensions are determined by the requirements of a specific application.

Figure 8:
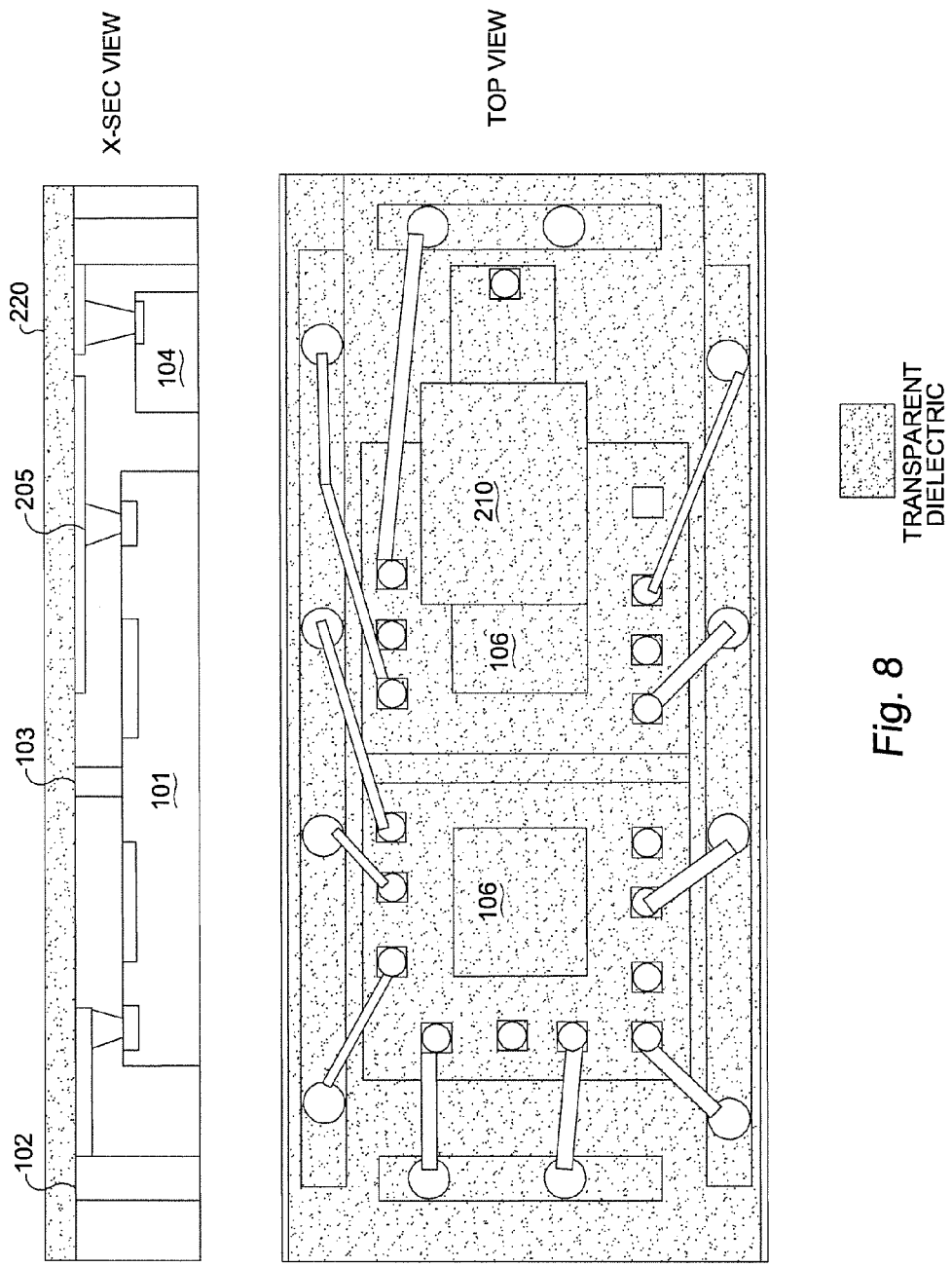

Referring now to FIG. 8, dielectric/passivation protection 220 of the top surface of the encapsulation layer 201 is shown. FIG. 8 thus shows dielectric 220 coating of the top surface of the encapsulation layer 201.

Figure 9:
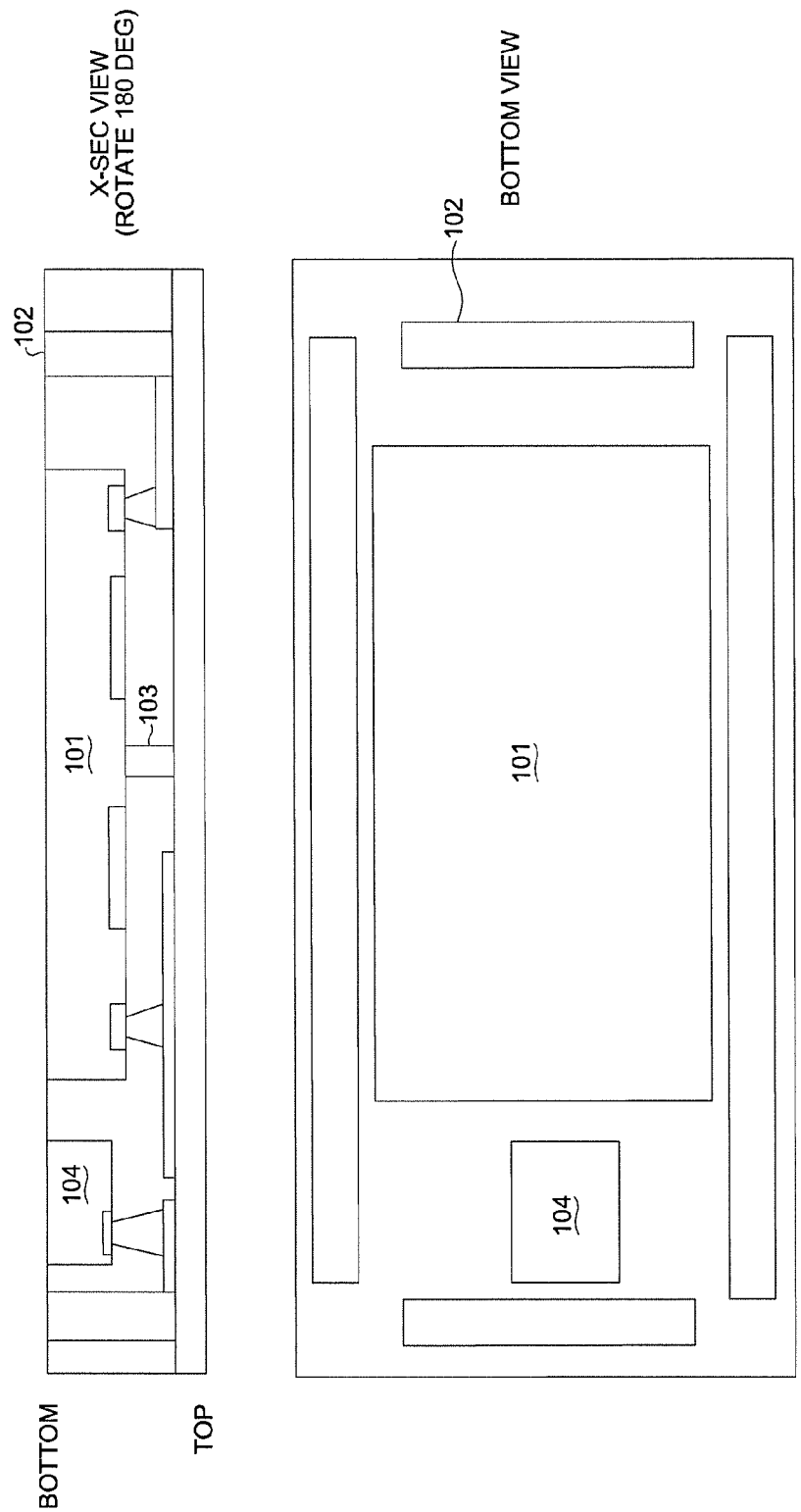

Referring now to FIG. 9, a flipped 180° view of the partially formed optical package of the present invention is shown. The cross-sectional view is the same as that shown in FIG. 8, but flipped, whereas the plan-view is of course a view of the bottom surface of the partially formed optical package of the present invention.

Figure 10:
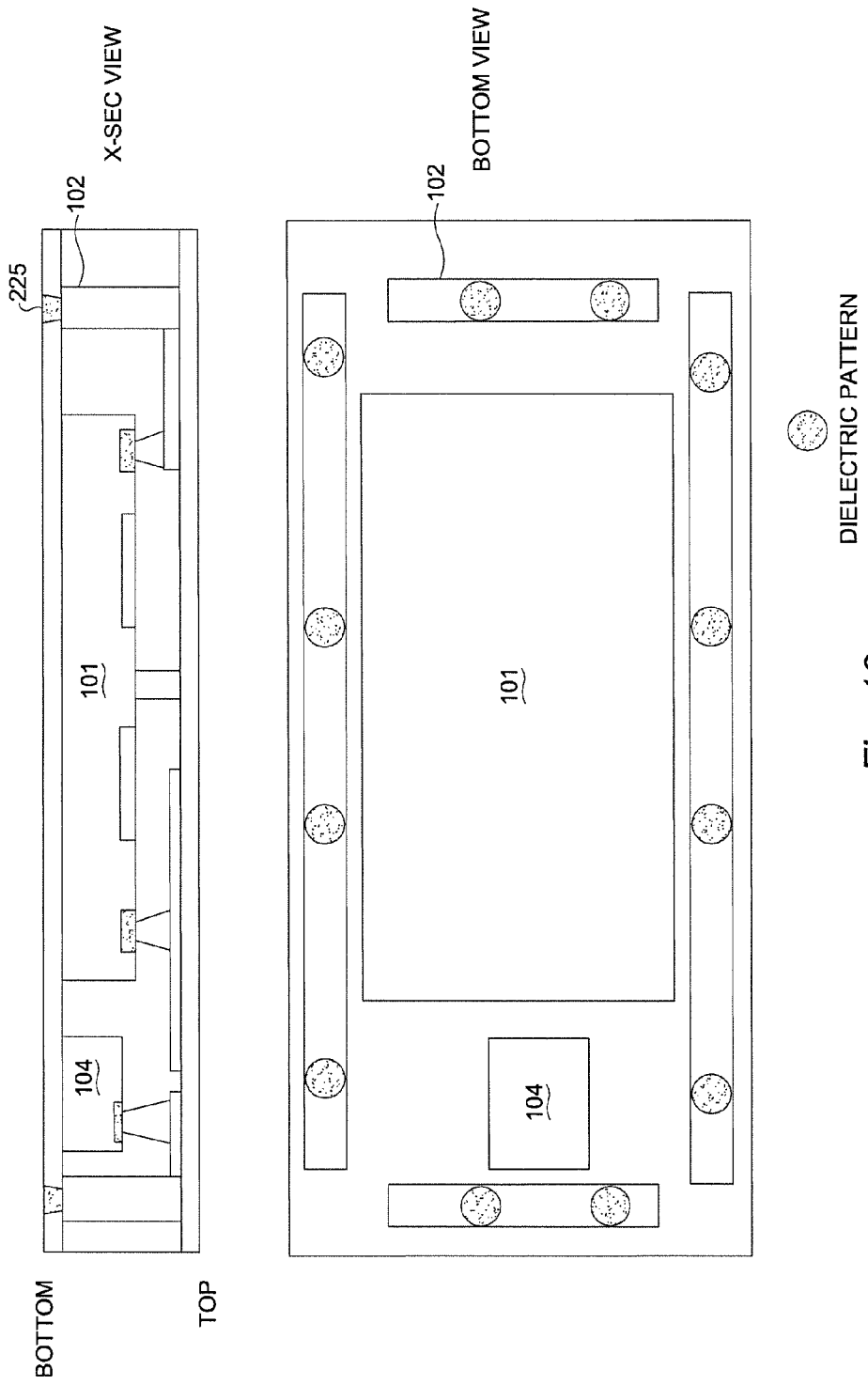

Referring now to FIG. 10, a dielectric pattern 225 on the bottom of the partially formed optical package of the present invention is shown. FIG. 10 thus shows a dielectric 225 coating of a bottom surface of the encapsulation layer 201.

Figure 11:
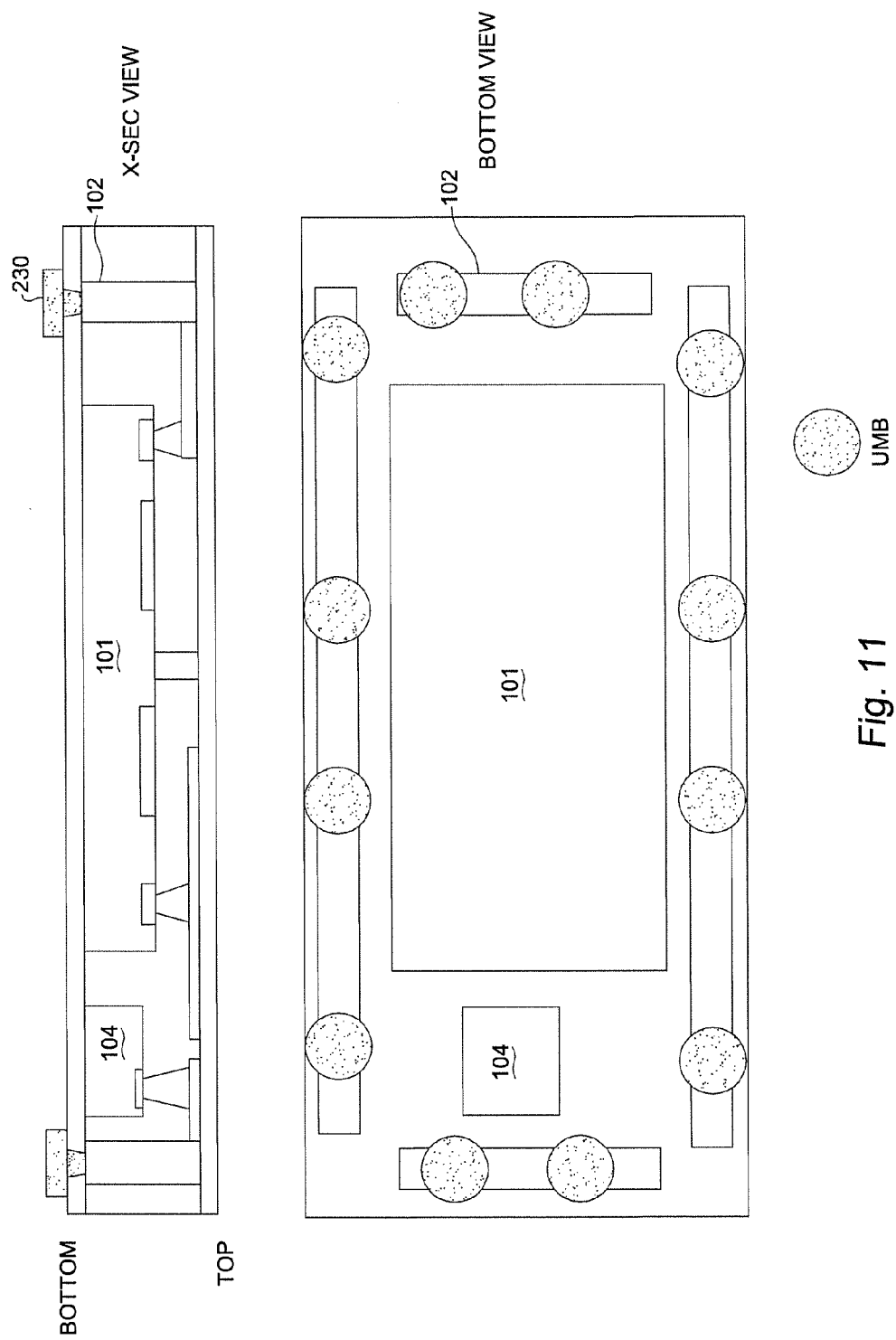

Referring now to FIG. 11 UBM or Ni/Au plating of the bottom portion of the PCB bars 102 through the patterned dielectric layer 225 is shown. FIG. 11 thus shows plating 230 the patterned dielectric coating 225 of the bottom surface of the encapsulation layer 201 to make electrical contact with the PCB bars 102.

Figure 12:
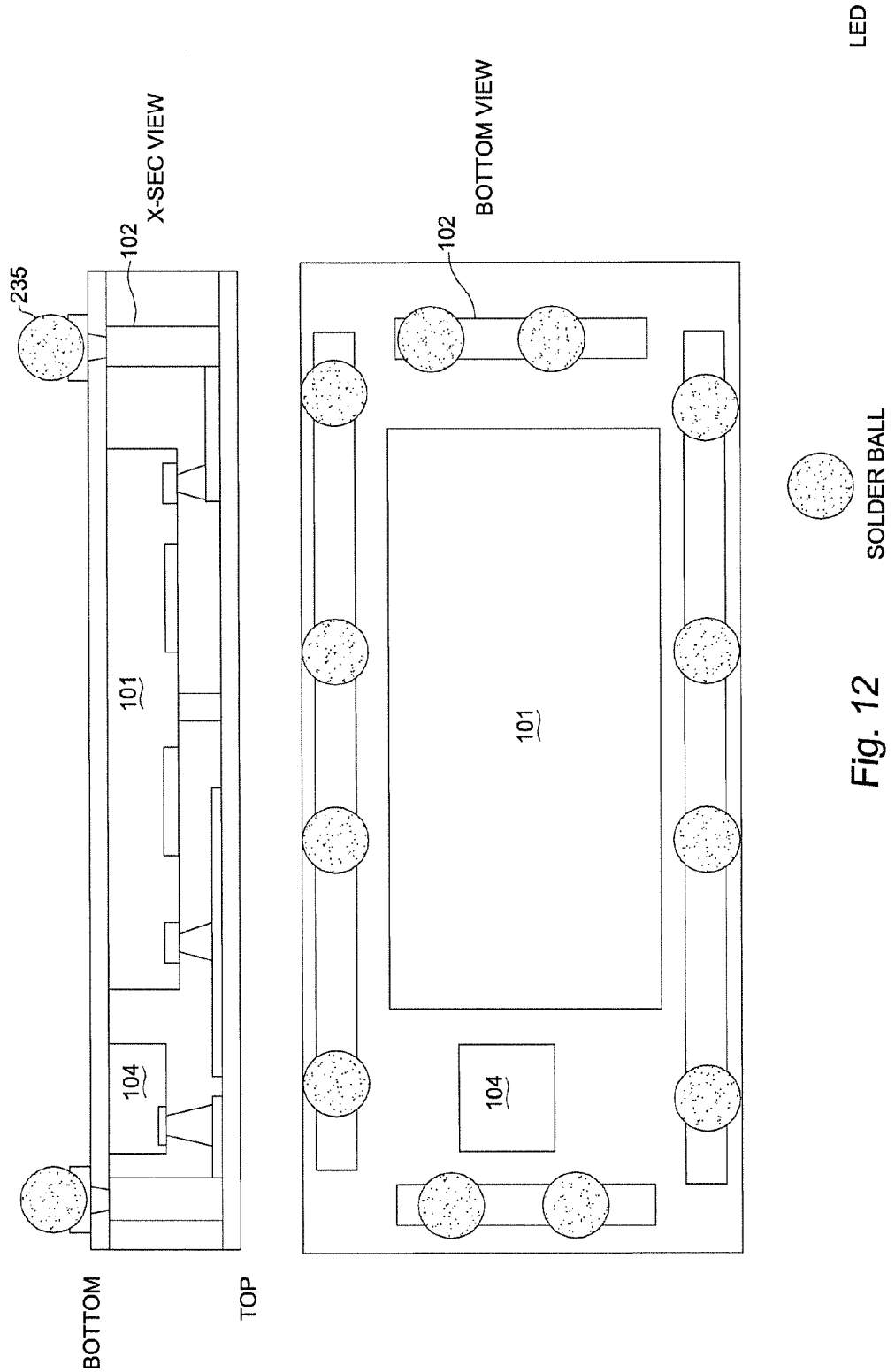

Referring now to FIG. 12, UBM solder ball placement 235 is shown. FIG. 12 thus shows solder balling 235 the plated and patterned dielectric coating 225 of the bottom surface of the encapsulation layer to make electrical contact with the PCB bars 102.

Figure 13:
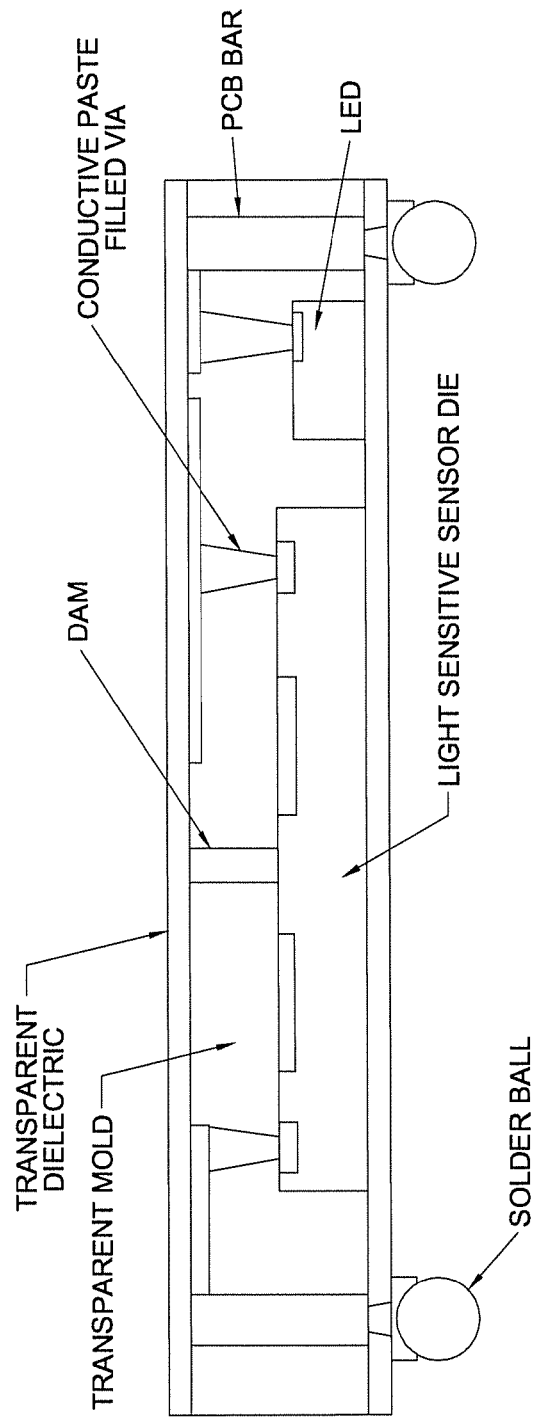
FIG. 13 is a cross-sectional view of the finished embedded wafer level optical package according to the present invention.

The final eWLOP structure is shown in FIG. 13, including the solder balls, the transparent molding encapsulation layer, the top-side transparent dielectric layer, the dam, the light sensitive sensor die, the conductive paste-filled vias, the PCB bars, and the LED.

The dam 103 can comprise a mold compound or silicon. Attaching the dam 103 can be accomplished using UV light or a heat curable glue. Encapsulating comprises encapsulation using a transparent mold compound 201. Grinding the encapsulation layer 201 comprises grinding to a thickness that exposes the PCB bars 102. The vias are formed using laser drilling or laser ablation. Metalizing 210, 215 the top surface of the encapsulation layer 201 comprises metalizing with copper lines using sputtering, patterning and plating. The dielectric 220 coating of the top surface comprises using a transparent dielectric material. Patterning the dielectric coating 225 of the bottom surface of the encapsulation layer 201 comprises using a lithography process. Plating 230 the patterned dielectric coating 225 of the bottom surface of the encapsulation layer 201 comprises using UBM (Under Bump Metalization) plating.

The package of the present invention is used primarily as a proximity sensor for mobile phones, but can be used in other applications if desired.

It will be apparent to those skilled in the art, therefore, that various modifications and variations can be made to the invention without departing from the spirit or scope of the invention. Thus, it is intended that the present invention covers the modifications and variations of this invention provided they come within the scope of the appended claims and their equivalents.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A method of forming an embedded wafer level optical package comprising:
   attaching a sensor die, PCB bars and an LED on adhesive tape laminated on a carrier;
   attaching a dam between two light sensitive sensors of the sensor die;
   encapsulating the sensor die, the PCB bars, the LED, and the dam in an encapsulation layer;
   debonding the carrier;
   grinding a top surface of the encapsulation layer;
   forming vias through the encapsulation layer to the sensor die and the LED;
   filling the vias with conductive material;
   metalizing the top surface of the encapsulation layer;
   dielectric coating of the top surface of the encapsulation layer;
   dielectric coating of a bottom surface of the encapsulation layer;
   patterning the dielectric coating of the bottom surface of the encapsulation layer; and
   plating the patterned dielectric coating of the bottom surface of the encapsulation layer.

2. The method of claim 1 further comprising solder balling the plated and patterned dielectric coating of the bottom surface of the encapsulation layer.

3. The method of claim 1, wherein the dam comprises a mold compound.

4. The method of claim 1, wherein the dam comprises silicon.

5. The method of claim 1, wherein attaching the dam comprises attachment using UV light.

6. The method of claim 1, wherein attaching the dam comprises attachment using a heat curable glue.

7. The method of claim 1, wherein encapsulating comprises encapsulation using a transparent mold compound.

8. The method of claim 1, wherein grinding the encapsulation layer comprises grinding to a thickness that exposes the PCB bars.

9. The method of claim 1, wherein the vias are formed using laser drilling.

10. The method of claim 1, wherein the vias are formed using laser ablation.

11. The method of claim 1, wherein metalizing the top surface of the encapsulation layer comprises metalizing with copper lines.

12. The method of claim 1, wherein metalizing the top surface of the encapsulation layer comprises sputtering, patterning and plating.

13. The method of claim 1, wherein dielectric coating of the top surface comprises using a transparent dielectric material.

14. The method of claim 1, wherein patterning the dielectric coating of the bottom surface of the encapsulation layer comprises using a lithography process.

15. The method of claim 1, wherein plating the patterned dielectric coating of the bottom surface of the encapsulation layer comprises using UBM (Under Bump Metalization) plating.

16. A method of forming an embedded wafer level optical package comprising:
   providing a sensor die, PCB bars, an LED, and a dam on the sensor die;
   encapsulating the sensor die, the PCB bars, the LED, and the dam in an encapsulation layer;
   grinding the encapsulation layer;
   forming vias through the encapsulation layer to the sensor die and the LED;
   filling the vias with conductive material;
   metalizing a top surface of the encapsulation layer; and
   dielectric coating of the top surface of the encapsulation layer.

17. The method of claim 16 further comprising dielectric coating of a bottom surface of the encapsulation layer.

18. The method of claim 17 further comprising patterning the dielectric coating of the bottom surface of the encapsulation layer.

19. The method of claim 18 further comprising plating the patterned dielectric coating of the bottom surface of the encapsulation layer.

20. The method of claim 19 further comprising solder balling the plated and patterned dielectric coating of the bottom surface of the encapsulation layer.

21. A method of forming an embedded wafer level optical package comprising:
   providing a sensor die, PCB bars, an LED, and a dam on the sensor die;
   transparently encapsulating the sensor die, the PCB bars, the LED, and the dam in an encapsulation layer;
   forming conductive vias through the encapsulation layer to the sensor die and the LED;
   metalizing a top surface of the encapsulation layer; and transparent dielectric coating of the top surface of the encapsulation layer.

* * * * *